United States Patent
Suyama

(10) Patent No.: US 11,509,401 B2
(45) Date of Patent: Nov. 22, 2022

(54) OPTICAL CONNECTOR AND POWER SOURCING EQUIPMENT OF POWER OVER FIBER SYSTEM, AND POWER OVER FIBER SYSTEM

(71) Applicant: KYOCERA Corporation, Kyoto (JP)

(72) Inventor: Takehiko Suyama, Yamato (JP)

(73) Assignee: KYOCERA CORPORATION, Kyoto (JP)

(*) Notice: Subject to any disclaimer, the term of this patent is extended or adjusted under 35 U.S.C. 154(b) by 0 days.

(21) Appl. No.: 17/442,619

(22) PCT Filed: May 29, 2020

(86) PCT No.: PCT/JP2020/021305
§ 371 (c)(1),
(2) Date: Sep. 24, 2021

(87) PCT Pub. No.: WO2020/246375
PCT Pub. Date: Dec. 10, 2020

(65) Prior Publication Data
US 2022/0094449 A1   Mar. 24, 2022

(30) Foreign Application Priority Data

Jun. 6, 2019   (JP) ............................ JP2019-105973

(51) Int. Cl.
*H04B 10/80*   (2013.01)
*G02B 6/42*    (2006.01)
*H01S 5/042*   (2006.01)

(52) U.S. Cl.
CPC ......... *H04B 10/807* (2013.01); *G02B 6/4206* (2013.01); *G02B 6/4292* (2013.01); (Continued)

(58) Field of Classification Search
CPC .............. H04B 10/807; H04B 2210/08; G02B 6/4206; G02B 6/4292; G02B 2006/4297; (Continued)

(56) References Cited

U.S. PATENT DOCUMENTS

2002/0181902 A1* 12/2002 O'Connor ............ G02B 6/4249
385/88
2008/0267620 A1* 10/2008 Cole ................... H04B 10/0775
398/17
(Continued)

FOREIGN PATENT DOCUMENTS

CN   201878048 U    6/2011
CN   106255908 A   12/2016
(Continued)

*Primary Examiner* — Leslie C Pascal
(74) *Attorney, Agent, or Firm* — Hauptman Ham LLP

(57) ABSTRACT

An optical connector of a power over fiber system includes a shutter. The shutter opens in conjunction with a connection operation to enable the connection and closes in conjunction with a disconnection operation to block feed light from exiting. A light receiving surface of the shutter is made of a wavelength conversion material. The light receiving surface receives the feed light when the shutter is closed. The optical connector is disposed at a feed-light output end in the power over fiber system.

8 Claims, 6 Drawing Sheets

(52) U.S. Cl.
CPC ...... *H01S 5/042* (2013.01); *G02B 2006/4297* (2013.01); *H04B 2210/08* (2013.01)

(58) Field of Classification Search
CPC ..... G02B 6/3895; G02B 6/4296; H01S 5/042; H02J 4/00; H02J 50/30
See application file for complete search history.

(56) References Cited

U.S. PATENT DOCUMENTS

2013/0301984 A1* 11/2013 Chan ................. H02J 50/30
385/24
2016/0277098 A1* 9/2016 Decker ................. H04B 10/03

FOREIGN PATENT DOCUMENTS

| | | | |
|---|---|---|---|
| JP | H453910 | A | 2/1992 |
| JP | H8331061 | A | 12/1996 |
| JP | 2001194562 | A | 7/2001 |
| JP | 2003131071 | A | 5/2003 |
| JP | 200794151 | A | 4/2007 |
| JP | 2010135989 | A | 6/2010 |
| JP | 2017058583 | A * | 3/2017 |
| WO | 2010146659 | A1 | 12/2010 |

* cited by examiner

OPTICAL CONNECTOR AND POWER SOURCING EQUIPMENT OF POWER OVER FIBER SYSTEM, AND POWER OVER FIBER SYSTEM

RELATED APPLICATIONS

The present application is a National Phase of International Application No. PCT/JP2020/021305 filed May 29, 2020, and claims priority based on Japanese Patent Application No. 2019-105973 filed Jun. 6, 2019.

TECHNICAL FIELD

The present disclosure relates to optical power supply.

BACKGROUND ART

Recently, there has been studied an optical power supply system that converts electric power into light (called feed light), transmits the feed light, converts the feed light into electric energy, and uses the electric energy as electric power.

There is disclosed in Patent Literature 1 an optical communication device that includes: an optical transmitter that transmits signal light modulated with an electric signal and feed light for supplying electric power; an optical fiber including a core that transmits the signal light, a first cladding that is formed around the core, has a refractive index lower than that of the core, and transmits the feed light, and a second cladding that is formed around the first cladding, and has a refractive index lower than that of the first cladding; and an optical receiver that operates with electric power obtained by converting the feed light transmitted through the first cladding of the optical fiber, and converts the signal light transmitted through the core of the optical fiber into the electric signal.

CITATION LIST

Patent Literature

Patent Literature 1: JP 2010-135989 A

SUMMARY OF INVENTION

Problem to Solve

In optical power supply, transmission of higher energy light is expected.

If a connector is and keeps being disengaged by an unforeseen incident during installation or operation of a power over fiber system, it may lead to an accident caused by energy of feed light. Hence, connector disengagement needs to be found as soon as possible.

Solution to Problem

An optical connector of a power over fiber system according to an aspect of the present disclosure is an optical connector of a power over fiber system, including a shutter that opens in conjunction with a connection operation to enable the connection and closes in conjunction with a disconnection operation to block feed light from exiting, wherein a light receiving surface of the shutter, the light receiving surface receiving the feed light when the shutter is closed, is a mirror plane, and wherein the optical connector is disposed at a feed-light output end in the power over fiber system.

An optical connector of a power over fiber system according to an aspect of the present disclosure is an optical connector of a power over fiber system, including a shutter that opens in conjunction with a connection operation to enable the connection and closes in conjunction with a disconnection operation to block feed light from exiting, wherein a light receiving surface of the shutter, the light receiving surface receiving the feed light when the shutter is closed, is made of a wavelength conversion material, and wherein the optical connector is disposed at a feed-light output end in the power over fiber system.

DESCRIPTION OF EMBODIMENTS

Hereinafter, embodiments of the present disclosure will be described with reference to the drawings.

(1) Outline of System

First Embodiment

Figure 1:
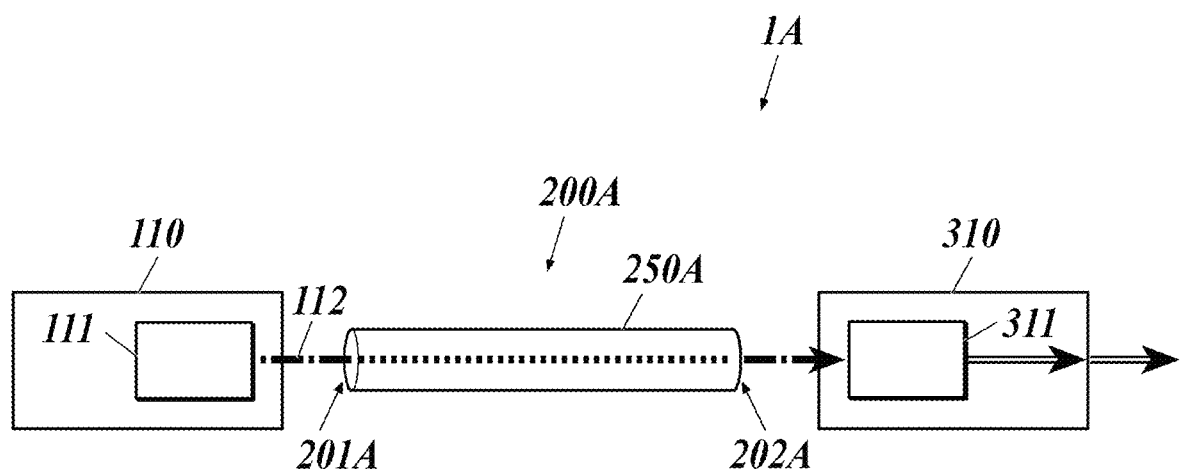
FIG. 1 is a block diagram of a power over fiber system according to a first embodiment of the present disclosure.

As shown in FIG. 1, a power over fiber (PoF) system 1A of this embodiment includes a power sourcing equipment (PSE) 110, an optical fiber cable 200A and a powered device (PD) 310.

In the present disclosure, a power sourcing equipment converts electric power into optical energy and supplies (sources) the optical energy, and a powered device receives (draws) the supplied optical energy and converts the optical energy into electric power.

The power sourcing equipment 110 includes a semiconductor laser 111 for power supply.

The optical fiber cable 200A includes an optical fiber 250A that forms a transmission path of feed light.

The powered device 310 includes a photoelectric conversion element 311.

The power sourcing equipment 110 is connected to a power source, and electrically drives the semiconductor laser 111 and so forth.

The semiconductor laser 111 oscillates with the electric power from the power source, thereby outputting feed light 112.

The optical fiber cable 200A has one end 201A connectable to the power sourcing equipment 110 and the other end 202A connectable to the powered device 310 to transmit the feed light 112.

The feed light 112 from the power sourcing equipment 110 is input to the one end 201A of the optical fiber cable 200A, propagates through the optical fiber 250A, and is output from the other end 202A of the optical fiber cable 200A to the powered device 310.

The photoelectric conversion element 311 converts the feed light 112 transmitted through the optical fiber cable 200A into electric power. The electric power obtained by the conversion of the feed light 112 by the photoelectric conversion element 311 is driving power needed in the powered device 310. The powered device 310 is capable of outputting, for an external device(s), the electric power obtained by the conversion of the feed light 112 by the photoelectric conversion element 311.

Semiconductor materials of semiconductor regions of the semiconductor laser 111 and the photoelectric conversion element 311 are semiconductors having a laser wavelength being a short wavelength of 500 nm or less. The semiconductor regions exhibit light-electricity conversion effect.

Semiconductors having a laser wavelength being a short wavelength have a large band gap and a high photoelectric conversion efficiency, and hence improve photoelectric conversion efficiency at the power supplying side and the power receiving side in optical power supply, and improve optical power supply efficiency.

Hence, as the semiconductor materials, laser media having a laser wavelength (base wave) of 200 nm to 500 nm may be used. Examples thereof include diamond, gallium oxide, aluminum nitride and gallium nitride.

Further, as the semiconductor materials, semiconductors having a band gap of 2.4 eV or greater are used.

For example, laser media having a band gap of 2.4 eV to 6.2 eV may be used. Examples thereof include diamond, gallium oxide, aluminum nitride and gallium nitride.

Laser light having a longer wavelength tends to have a higher transmission efficiency, whereas laser light having a shorter wavelength tends to have a higher photoelectric conversion efficiency. Hence, when laser light is transmitted for a long distance, laser media having a laser wavelength (base wave) of greater than 500 nm may be used as the semiconductor materials, whereas when the photoelectric conversion efficiency is given priority, laser media having a laser wavelength (base wave) of less than 200 nm may be used as the semiconductor materials.

Any of these semiconductor materials may be used in one of the semiconductor laser 111 and the photoelectric conversion element 311. This improves the photoelectric conversion efficiency at either the power supplying side or the power receiving side, and improves the optical power supply efficiency.

Second Embodiment

Figure 2:
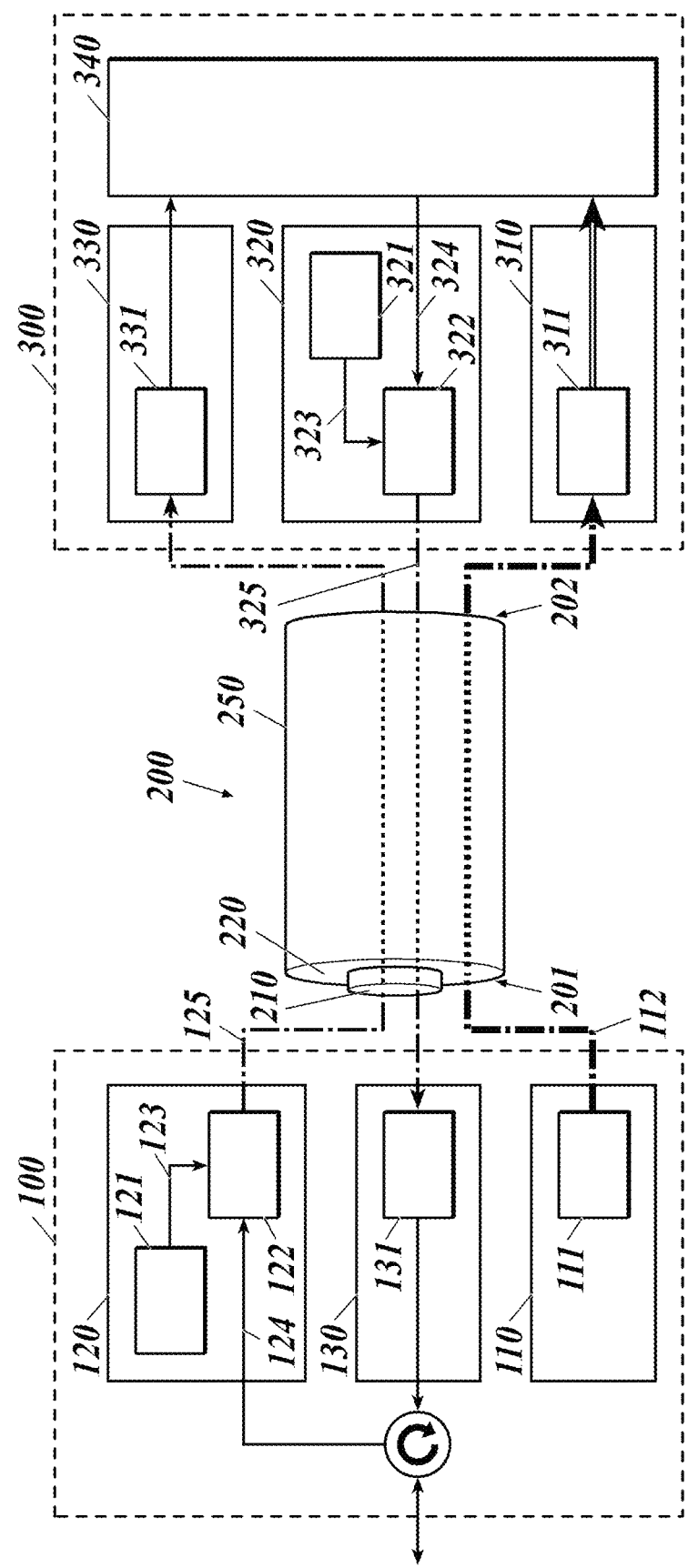
FIG. 2 is a block diagram of a power over fiber system according to a second embodiment of the present disclosure.

As shown in FIG. 2, a power over fiber (PoF) system 1 of this embodiment includes a power supply system through an optical fiber and an optical communication system therethrough, and includes: a first data communication device 100 including a power sourcing equipment (PSE) 110; an optical fiber cable 200; and a second data communication device 300 including a powered device (PD) 310.

The power sourcing equipment 110 includes a semiconductor laser 111 for power supply. The first data communication device 100 includes, in addition to the power sourcing equipment 110, a transmitter 120 and a receiver 130 for data communication. The first data communication device 100 corresponds to a data terminal equipment (DTE), a repeater or the like. The transmitter 120 includes a semiconductor laser 121 for signals and a modulator 122. The receiver 130 includes a photodiode 131 for signals.

The optical fiber cable 200 includes an optical fiber 250 including: a core 210 that forms a transmission path of signal light; and a cladding 220 that is arranged so as to surround the core 210 and forms a transmission path of feed light.

The powered device 310 includes a photoelectric conversion element 311. The second data communication device 300 includes, in addition to the powered device 310, a transmitter 320, a receiver 330 and a data processing unit 340. The second data communication device 300 corresponds to a power end station or the like. The transmitter 320 includes a semiconductor laser 321 for signals and a modulator 322. The receiver 330 includes a photodiode 331 for signals. The data processing unit 340 processes received signals. The second data communication device 300 is a node in a communication network. The second data communication device 300 may be a node that communicates with another node.

The first data communication device 100 is connected to a power source, and electrically drives the semiconductor laser 111, the semiconductor laser 121, the modulator 122, the photodiode 131 and so forth. The first data communication device 100 is a node in a communication network. The first data communication device 100 may be a node that communicates with another node.

The semiconductor laser 111 oscillates with the electric power from the power source, thereby outputting feed light 112.

The photoelectric conversion element 311 converts the feed light 112 transmitted through the optical fiber cable 200 into electric power. The electric power obtained by the conversion of the feed light 112 by the photoelectric conversion element 311 is driving power needed in the second data communication device 300, for example, driving power for the transmitter 320, the receiver 330 and the data processing unit 340. The second data communication device 300 may be capable of outputting, for an external device(s), the electric power obtained by the conversion of the feed light 112 by the photoelectric conversion element 311.

The modulator 122 of the transmitter 120 modulates laser light 123 output by the semiconductor laser 121 to signal light 125 on the basis of transmission data 124, and outputs the signal light 125.

The photodiode 331 of the receiver 330 demodulates the signal light 125 transmitted through the optical fiber cable 200 to an electric signal, and outputs the electric signal to the data processing unit 340. The data processing unit 340 transmits data of the electric signal to a node, and also receives data from the node and outputs the data to the modulator 322 as transmission data 324.

The modulator 322 of the transmitter 320 modulates laser light 323 output by the semiconductor laser 321 to signal light 325 on the basis of the transmission data 324, and outputs the signal light 325.

The photodiode 131 of the receiver 130 demodulates the signal light 325 transmitted through the optical fiber cable 200 to an electric signal, and outputs the electric signal. Data of the electric signal is transmitted to a node, whereas data from the node is the transmission data 124.

The feed light 112 and the signal light 125 from the first data communication device 100 are input to one end 201 of the optical fiber cable 200, propagate through the cladding 220 and the core 210, respectively, and are output from the other end 202 of the optical fiber cable 200 to the second data communication device 300.

The signal light 325 from the second data communication device 300 is input to the other end 202 of the optical fiber cable 200, propagates through the core 210, and is output from the one end 201 of the optical fiber cable 200 to the first data communication device 100.

Figure 3:
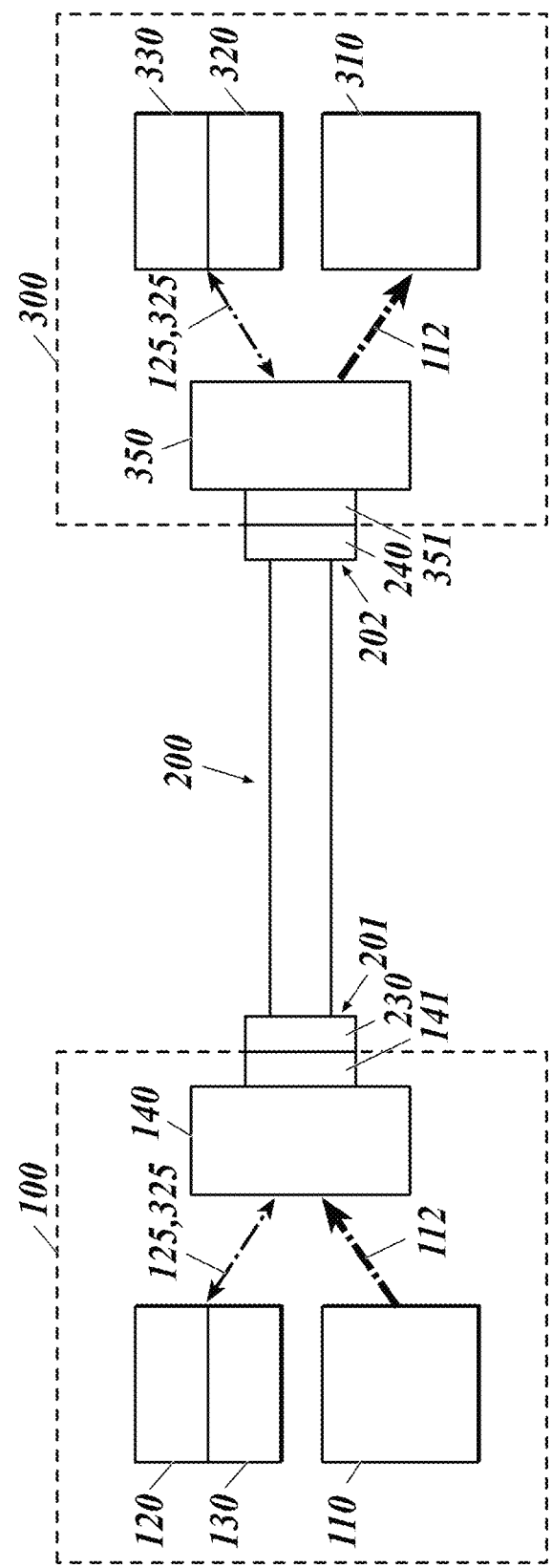
FIG. 3 is a block diagram of the power over fiber system according to the second embodiment of the present disclosure and shows optical connectors and so forth.

As shown in FIG. 3, the first data communication device 100 includes a light input/output part 140 and an optical connector 141 attached to the light input/output part 140, and the second data communication device 300 includes a light input/output part 350 and an optical connector 351 attached to the light input/output part 350. An optical connector 230 provided at the one end 201 of the optical fiber cable 200 is connected to the optical connector 141, and an optical connector 240 provided at the other end 202 of the optical fiber cable 200 is connected to the optical connector 351. The light input/output part 140 guides the feed light 112 to the cladding 220, guides the signal light 125 to the core 210, and guides the signal light 325 to the receiver 130. The light input/output part 350 guides the feed light 112 to the powered device 310, guides the signal light 125 to the receiver 330, and guides the signal light 325 to the core 210.

As described above, the optical fiber cable 200 has the one end 201 connectable to the first data communication device 100 and the other end 202 connectable to the second data communication device 300 to transmit the feed light 112. In this embodiment, the optical fiber cable 200 transmits the signal light 125, 325 bidirectionally.

As the semiconductor materials of the semiconductor regions, which exhibit the light-electricity conversion effect, of the semiconductor laser 111 and the photoelectric conversion element 311, any of those described in the first embodiment can be used, thereby achieving a high optical power supply efficiency.

Figure 4:
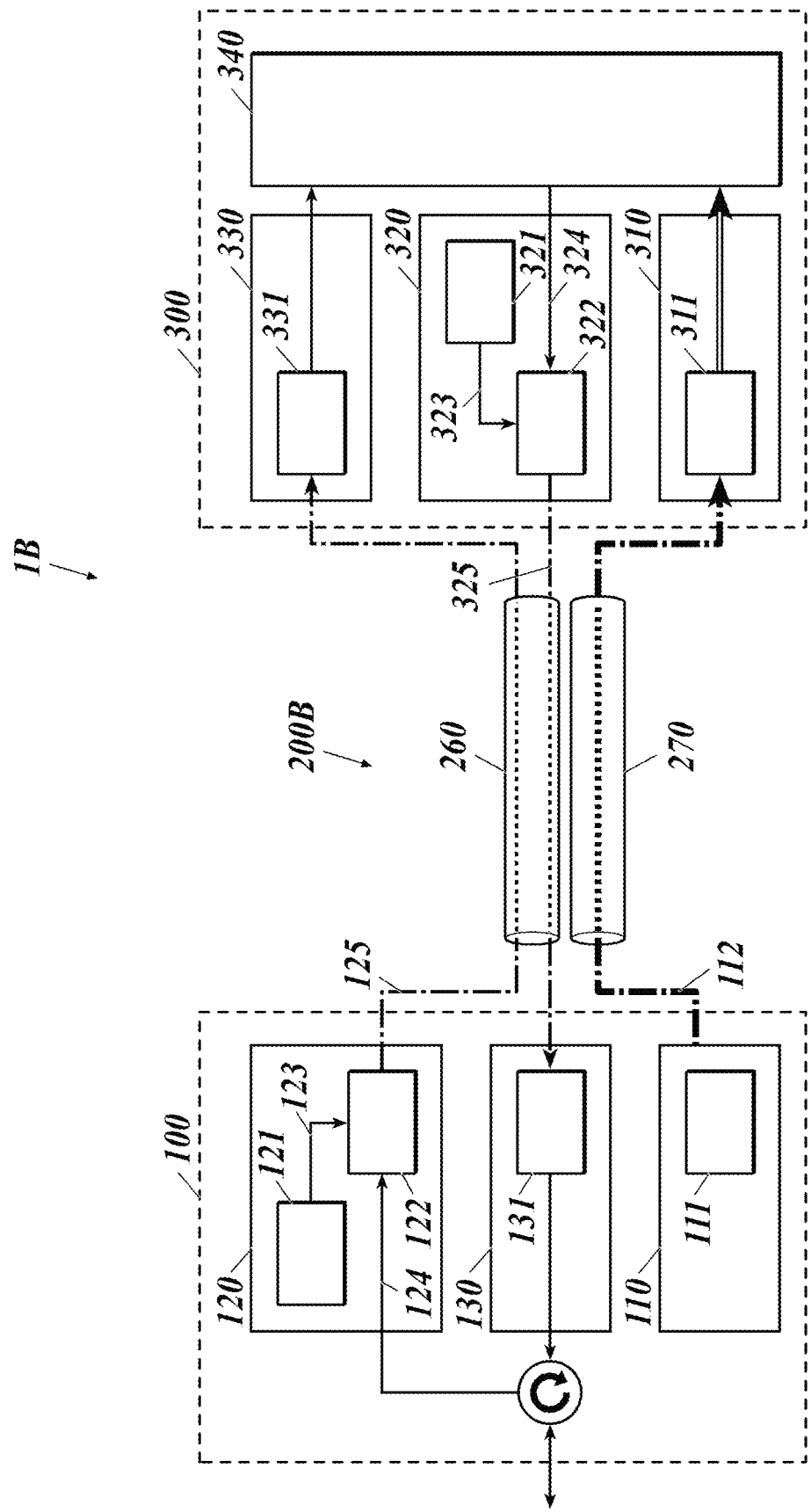
FIG. 4 is a block diagram of a power over fiber system according to another embodiment of the present disclosure.

Like an optical fiber cable 200B of a power over fiber system 1B shown in FIG. 4, an optical fiber 260 that transmits signal light and an optical fiber 270 that transmits feed light may be provided separately. Further, the optical fiber cable 200B may be composed of a plurality of optical fiber cables.

(2) Optical Connector Including Shutter

Next, an optical connector including a shutter will be described with reference to FIG. 5.

Figure 5:
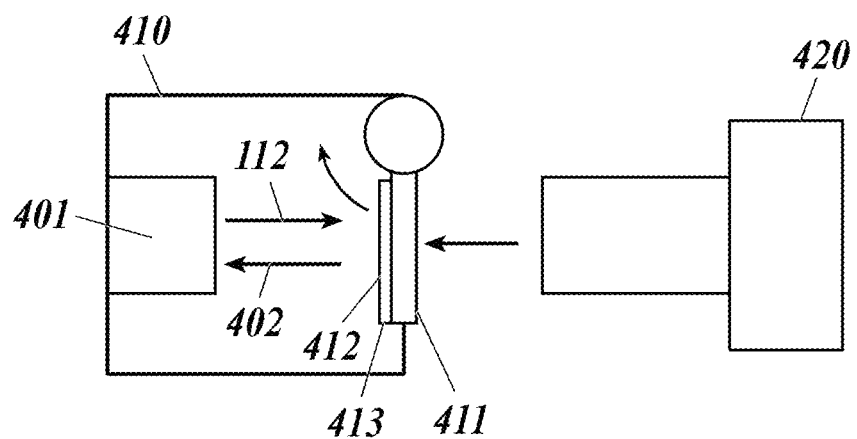
FIG. 5 is a block diagram of a shutter including an optical connector and a mating connector.

As shown in FIG. 5, an optical connector 410 is disposed at an output end 401 for the feed light 112 in the power over fiber system 1, 1A or 1B.

An optical connector 420 is a mating connector that is connected to the optical connector 410.

The optical connector 410 is used as the optical connector 141 or the optical connector 240 shown in FIG. 3, and the optical connector 420 is used as the optical connector 230 or the optical connector 351 shown in FIG. 3.

The optical connector 410 has a shutter 411. The shutter 411 opens in conjunction with a connection operation of connecting the optical connector 410 and the optical connector 420 to one another to enable the connection.

The shutter 411 closes in conjunction with a disconnection operation of disconnecting the optical connector 410 and the optical connector 420 from one another to block the feed light 112 from exiting to the outside. The mechanism that closes the shutter 411 is configured by a hinge mechanism or the like having an elastic member that biases the shutter 411 in a closing direction.

As one form thereof, as shown in FIG. 5, a form is carried out in which a light receiving surface 412 of the shutter 411, the light receiving surface 412 receiving the feed light 112 when the shutter 411 is closed, is a mirror plane. That is, the light receiving surface 412 that is the inner surface of the shutter 411 is a mirror plane. A member 413 that constitutes the light receiving surface 412 is a reflecting mirror, and this mirror plane constitutes the light receiving surface 412.

When the shutter 411 is closed, the feed light 112 is reflected by the mirror plane (412) of the reflecting mirror (413) and thereby becomes return light 402. Part of the return light 402 enters the output end 401.

Figure 6:
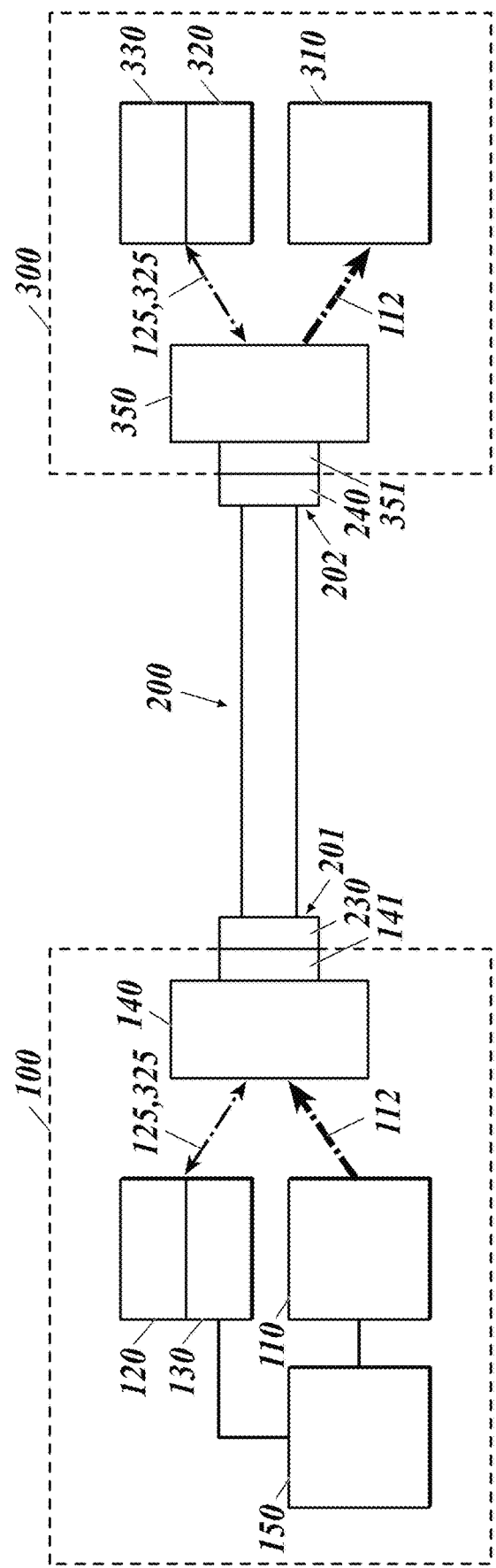
FIG. 6 is a block diagram of the power over fiber system according to the second embodiment of the present disclosure with a control device added.

A control device 150 shown in FIG. 6 detects connector disengagement by detecting the return light 402 emitted from the shutter 411, and controls the power sourcing equipment 110 such that the power sourcing equipment 110 stops outputting the feed light 112.

The return light 402 comes back through the propagation path of the feed light or the propagation path of the signal light. Hence, the control device 150 can detect the connector disengagement by analyzing the return light 402 received by a photodiode. As the photodiode, the photodiode 131 may be used, or a dedicated one may be provided.

Instead of the reflecting mirror, a wavelength conversion material, such as a fluorescent material, may be used. That is, as shown in FIG. 5, a form is carried out in which the light receiving surface 412 of the shutter 411, the light receiving surface 412 receiving the feed light 112 when the shutter 411 is closed, is made of a wavelength conversion material. In other words, the member 413 that constitutes the light receiving surface 412 that is the inner surface of the shutter 411 is a wavelength conversion material.

When the shutter 411 is closed, the feed light 112 irradiates the wavelength conversion material (413), and the return light 402 containing light having a wavelength different from that of the feed light 112 is emitted from the wavelength conversion material (413). Part of the return light 402 enters the output end 401.

The control device 150 shown in FIG. 6 detects the connector disengagement by detecting the abovementioned component having a different wavelength contained in the return light 402 emitted from the shutter 411, and controls the power sourcing equipment 110 such that the power sourcing equipment 110 stops outputting the feed light 112.

Selecting a wavelength conversion material that makes the return light 402 contain a light having a wavelength different from either that of the feed light 112 or that of the signal light can make discrimination of the return light 402 excellent.

The wavelength conversion material may be of a nature that converts the entire received light into light having a different wavelength(s), or of a nature that performs spread spectrum over the wavelength of the received light and a wavelength(s) different from that of the received light.

As described above, the shutter 411 can prevent leakage of the feed light 112 at the time of the connector disengagement.

Further, the return light 402 emitted from the shutter 411 makes it easy to detect the shutter disengagement.

The light receiving surface 412 of the shutter 411 for the feed light 112 being a mirror plane can ensure the intensity of the return light 402, and enables the detection even if the return path is a long distance.

The light receiving surface 412 of the shutter 411 for the feed light 112 being made of a wavelength conversion material can make discrimination of the return light 402 from other light, such as stray light internally derived, excellent, and ensure the detection accuracy of the connector disengagement.

Further, the control device 150 stops the feed light 112 from being output, which can prevent heat generation or breakage caused by the feed light 112 irradiating the shutter 411 for a long time and consequently prevent accidents, and also can stop wasteful electric power consumption.

Although some embodiments of the present disclosure have been described above, these embodiments are made for purposes of illustration and example only. The present invention can be carried out in various other forms, and each component may be omitted, replaced or modified/changed within a range not departing from the scope of the present invention.

INDUSTRIAL APPLICABILITY

The present invention is applicable to an optical connector and a power sourcing equipment of a power over fiber system and to a power over fiber system.

REFERENCE SIGNS LIST

1A Power over Fiber System
1 Power over Fiber System
1B Power over Fiber System
100 First Data Communication Device
110 Power Sourcing Equipment
111 Semiconductor Laser for Power Supply
112 Feed Light
120 Transmitter
125 Signal Light
130 Receiver
140 Light Input/Output Part
141 Optical Connector
200A Optical Fiber Cable
200 Optical Fiber Cable
200B Optical Fiber Cable
210 Core
220 Cladding
250A Optical Fiber
250 Optical Fiber
260 Optical Fiber
270 Optical Fiber
300 Second Data Communication Device
310 Powered Device
311 Photoelectric Conversion Element
320 Transmitter
325 Signal Light
330 Receiver
350 Light Input/Output Part
351 Optical Connector
410 Optical Connector
411 Shutter
420 Optical Connector

The invention claimed is:

1. An optical connector of a power over fiber system, the optical connector comprising: a shutter configured to
   open in conjunction with a connection operation to enable the connection and
   close in conjunction with a disconnection operation to block feed light from exiting,
   wherein a light receiving surface of the shutter, the light receiving surface receiving the feed light when the shutter is closed, is made of a wavelength conversion material, and
   wherein the optical connector is disposed at a feed-light output end in the power over fiber system.

2. A power sourcing equipment of a power over fiber system, the power sourcing equipment comprising:
   the optical connector according to claim 1 at the feed-light output end; and
   a semiconductor laser configured to output the feed light,
   wherein a semiconductor material of a semiconductor region of the semiconductor laser, the semiconductor region exhibiting a light-electricity conversion effect, is a laser medium having a laser wavelength of 500 nm or less.

3. A power sourcing equipment of a power over fiber system comprising:
   the optical connector according to claim 1; and
   a semiconductor laser configured to output the feed light,
   wherein a semiconductor material of a semiconductor region of the semiconductor laser, the semiconductor region exhibiting a light-electricity conversion effect, is a laser medium having a laser wavelength of 500 nm or less, and
   wherein the power sourcing equipment comprises a control device configured to detect connector disengagement by detecting return light emitted from the shutter and stop the feed light from being output.

4. A power over fiber system, comprising:
   the optical connector according to claim 1; and
   a control device configured to detect connector disengagement by detecting return light emitted from the shutter and stop the feed light from being output.

5. A power over fiber system, comprising:
   a power sourcing equipment including
      a first optical connector including a first shutter that is configured to open in conjunction with a first connection operation to enable a first connection and close in conjunction with a first disconnection operation to block feed light from exiting, wherein a light receiving surface of the first shutter, the light receiving surface receiving the feed light when the first shutter is closed, is made of a wavelength conversion material, and wherein the first optical connector is disposed at a feed-light output end in the power over fiber system, and
      a semiconductor laser configured to output the feed light, wherein a semiconductor material of a semiconductor region of the semiconductor laser, the semiconductor region exhibiting a light-electricity conversion effect, is a laser medium having a laser wavelength of 500 nm or less;
   a powered device including a photoelectric conversion element configured to convert the feed light output by the power sourcing equipment into electric power;
   an optical fiber cable having an end connectable to the power sourcing equipment and another end connectable to the powered device to transmit the feed light; and
   (i) a second optical connector including a second shutter that is configured to open in conjunction with a second connection operation to enable a second connection and close in conjunction with a second disconnection operation to block feed light from exiting, wherein a light receiving surface of the second shutter, the light receiving surface receiving the feed light when the second shutter is closed, is a mirror plane or (ii) a third optical connector, at the another end of the optical fiber cable,
   wherein the third optical connector comprises a third shutter configured to open in conjunction with a third connection operation to enable a third connection and close in conjunction with a third disconnection operation to block feed light from exiting,
wherein a light receiving surface of the third shutter, the light receiving surface receiving the feed light when the third shutter is closed, is made of a wavelength conversion material, and
wherein the third optical connector is disposed at another feed-light output end in the power over fiber system.

6. The power over fiber system according to claim 5, further comprising a control device that detects configured to
detect connector disengagement by detecting return light emitted from the first shutter of the first optical connector or the second shutter of the second optical connector and
stop the feed light from being output.

7. A power over fiber system, comprising:
(i) a first power sourcing equipment including: at a fiber-light output end, a first optical connector including a first shutter that is configured to open in conjunction with a first connection operation to enable a first connection and close in conjunction with a first disconnection operation to block feed light from exiting, wherein a light receiving surface of the first shutter, the light receiving surface receiving the feed light when the first shutter is closed, is a mirror plane; and a first semiconductor laser configured to output the feed light, wherein a semiconductor material of a first semiconductor region of the first semiconductor laser, the first semiconductor region exhibiting a light-electricity conversion effect, is a first laser medium having a laser wavelength of 500 nm or less, or (ii) a second power sourcing equipment including: at a feed-light output end, a second optical connector including a second shutter that is configured to open in conjunction with a second connection operation to enable a second connection and close in conjunction with a second disconnection operation to block feed light from exiting, wherein a light receiving surface of the second shutter, the light receiving surface receiving the feed light when the second shutter is closed, is made of a wavelength conversion material; and a second semiconductor laser configured to output the feed light, wherein a semiconductor material of a second semiconductor region of the second semiconductor laser, the second semiconductor region exhibiting a light-electricity conversion effect, is a second laser medium having a laser wavelength of 500 nm or less;
a powered device including a photoelectric conversion element that is configured to convert the feed light output by the first power sourcing equipment or the second power sourcing equipment into electric power;
an optical fiber cable having an end connectable to the first power sourcing equipment or the second power sourcing equipment and another end connectable to the powered device to transmit the feed light; and
a third optical connector at the another end of the optical fiber cable,
wherein the third optical connector comprises a third shutter configured to open in conjunction with a third connection operation to enable the third connection and close in conjunction with a third disconnection operation to block feed light from exiting,
wherein a light receiving surface of the third shutter, the light receiving surface receiving the feed light when the third shutter is closed, is made of a wavelength conversion material, and
wherein the third optical connector is disposed at a feed-light output end in the power over fiber system.

8. The power over fiber system according to claim 7, further comprising a control device configured to
detect connector disengagement by detecting return light emitted from the first shutter of the first optical connector or the second shutter of the second optical connector and
stop the feed light from being output.

* * * * *